(12) United States Patent
Zelissen et al.

(10) Patent No.: US 7,096,676 B2
(45) Date of Patent: Aug. 29, 2006

(54) ELECTRIC COOLING DEVICE

(75) Inventors: Marcus Jozef Gertrudis Zelissen, Maasbree (NL); Daniël Arnoldus Maris Zelissen, Maastricht (NL)

(73) Assignee: Top-Cool Holding B.V., (NL)

( * ) Notice: Subject to any disclaimer, the term of this patent is extended or adjusted under 35 U.S.C. 154(b) by 0 days.

(21) Appl. No.: 10/475,717

(22) PCT Filed: Apr. 24, 2002

(86) PCT No.: PCT/NL02/00268

§ 371 (c)(1),
(2), (4) Date: Apr. 26, 2004

(87) PCT Pub. No.: WO02/086980

PCT Pub. Date: Oct. 31, 2002

(65) Prior Publication Data

US 2004/0177623 A1  Sep. 16, 2004

(30) Foreign Application Priority Data

Apr. 24, 2001 (NL) .................................. 1017913
Jul. 9, 2001 (NL) .................................. 1018493

(51) Int. Cl.
*F25B 21/02* (2006.01)
(52) U.S. Cl. .................. 62/3.2; 62/3.3; 62/3.7
(58) Field of Classification Search ............ 62/3.2–3.7, 62/259.2; 361/668, 676, 677
See application file for complete search history.

(56) References Cited

U.S. PATENT DOCUMENTS

| | | | |
|---|---|---|---|
| 3,449,172 A | 6/1969 | Dingwall | |
| 3,607,444 A | 9/1971 | Debucs | |
| 4,470,263 A * | 9/1984 | Lehovec et al. ............... | 62/3.5 |
| 4,476,685 A * | 10/1984 | Aid .............................. | 62/3.3 |
| 4,748,495 A | 5/1988 | Kucharek | |
| 5,028,988 A | 7/1991 | Porter et al. | |
| 5,031,689 A | 7/1991 | Jones et al. | |
| 5,032,897 A * | 7/1991 | Mansuria et al. ........... | 257/701 |
| 5,306,866 A * | 4/1994 | Gruber et al. ............. | 174/15.1 |
| 5,584,183 A * | 12/1996 | Wright et al. ................. | 62/3.7 |
| 5,841,064 A * | 11/1998 | Maekawa et al. ........... | 136/203 |
| 5,918,469 A | 7/1999 | Cardella | |
| 6,119,462 A | 9/2000 | Burrows et al. | |
| 6,185,941 B1 * | 2/2001 | Watanabe et al. ............. | 62/3.7 |
| 6,333,849 B1 * | 12/2001 | Donahoe et al. ............ | 361/687 |

(Continued)

FOREIGN PATENT DOCUMENTS

EP     0 435 586 A      7/1991

(Continued)

*Primary Examiner*—Mohammad M. Ali
(74) *Attorney, Agent, or Firm*—DLA Piper Rudnick Gray Cary US LLP

(57) ABSTRACT

A cooling device including a housing with at least one cooling channel for cooling a liquid, and with at least one thermoelectric cooling element including a layer of semiconductor material that is sandwiched between two plates, at least one of the plates having an electrically insulating contact surface that, in use, is in direct contact with the cooling liquid, the at least one cooling element being sealingly mounted in a carrier such that the contact surface remains free to contact the cooling liquid, the carrier and the contact surface defining a wall portion of the cooling channel, wherein the at least one cooling element is along its outer perimeter of the at least one cooling element being formed by the outer edges of the surface of at least one of the plates and at least a portion of the rim.

15 Claims, 7 Drawing Sheets

U.S. PATENT DOCUMENTS 6,345,506 B1 * 2/2002 Kontani et al. ............... 62/3.2

FOREIGN PATENT DOCUMENTS

| EP | 0 467 711 A | 1/1992 |
| EP | 0 516 280 A | 12/1992 |
| FR | 2 477 780 A | 9/1981 |

* cited by examiner

US 7,096,676 B2

ELECTRIC COOLING DEVICE

RELATED APPLICATION

This is a §371 of International Application No. PCT/NL02/00268, with an international filing date of Apr. 24, 2002 (WO 02/086980 A1, published Oct. 31, 2002), which claims priority of NL 1017913, filed Apr. 24, 2001, and NL 1018493, filed Jul. 9, 2001.

FIELD OF THE INVENTION

The invention relates to a cooling device comprising a housing with at least one cooling channel for a cooling liquid, and with at least one thermoelectric cooling element comprising a layer of semiconductor material that is sandwiched between two plates, at least one of the plates having an electrically insulating contact surface that, in use, is in direct contact with the cooling liquid, the at least one cooling element being sealingly mounted in a carrier such that the contact surface remains free to contract the cooling liquid, the carrier and the contact surface defining a wall portion of the cooling channel.

BACKGROUND

Cooling devices are known from U.S. Pat. No. 5,918,469. In the cooling device of U.S. Pat. No. 5,918,469, the cooling element is clamped in the carrier with a gasket positioned on the top plate of the cooling element to provide a seal.

U.S. Pat. No. 6,119,462 discloses a water cooler having a thermoelectric cooling element for maintaining a supply of water at a reduced temperature level. The cooling element is clamped between two flanges of the housing, such that the warm side of the module is in direct contact with cooling liquid flowing through the cooling channel, thus enabling an efficient cooling proces, while the cold side of the module abuts against the base of a chiller probe that is in conductive thermal contact with the supply of water to be cooled.

A problem associated with the known devices is that the clamp construction may cause leakage due to thermal expansion and contraction of the cooling element. In addition, the tolerance for size aid shape of the thermoelectric element must be kept small, and the clamping force must be relatively high. In view of the above, only one cooling element can be used in each clamp construction. Further, due to their brittle structure, low cost cooling elements of semiconductor material sandwiched between ceramic plates of low size and shape tolerance cannot be used in mechanically demanding applications.

It would therefore be advantageous to provide a cooling device in which the advantage of efficient cooling by direct contact of the cooling element with the cooling liquid is maintained, while the above problems are alleviated. In particular, it would be advantageous to provide a cooling device in which an array of standardized cooling elements of semiconductor material sandwiched between plates of ceramic material, each having low size and shape tolerance can be provided in a simple and elegant manner.

SUMMARY OF THE INVENTION

This invention relates to a cooling device including a housing with at least one cooling channel for cooling a liquid, and with at least one thermoelectric cooling element including a layer of semiconductor material that is sandwiched between two plates, at least one of the plates having an electrically insulating contact surface that, in use, is in direct contact with the cooling liquid, the at least one cooling element being sealingly mounted in a carrier such that the contact surface remains free to contact the cooling liquid, the carrier and the contact surface defining a wall portion of the cooling channel, wherein the at least one cooling element is along its outer perimeter sealingly framed in the carrier, the outer perimeter of the at least one cooling element being formed by the outer edges of the surface of at least one of the plates and at least a portion of the rim.

BRIEF DESCRIPTION OF THE DRAWINGS

The invention shall be illucidated using exemplary embodiments shown in the drawing. In the drawings.

DETAILED DESCRIPTION

Figure 1:
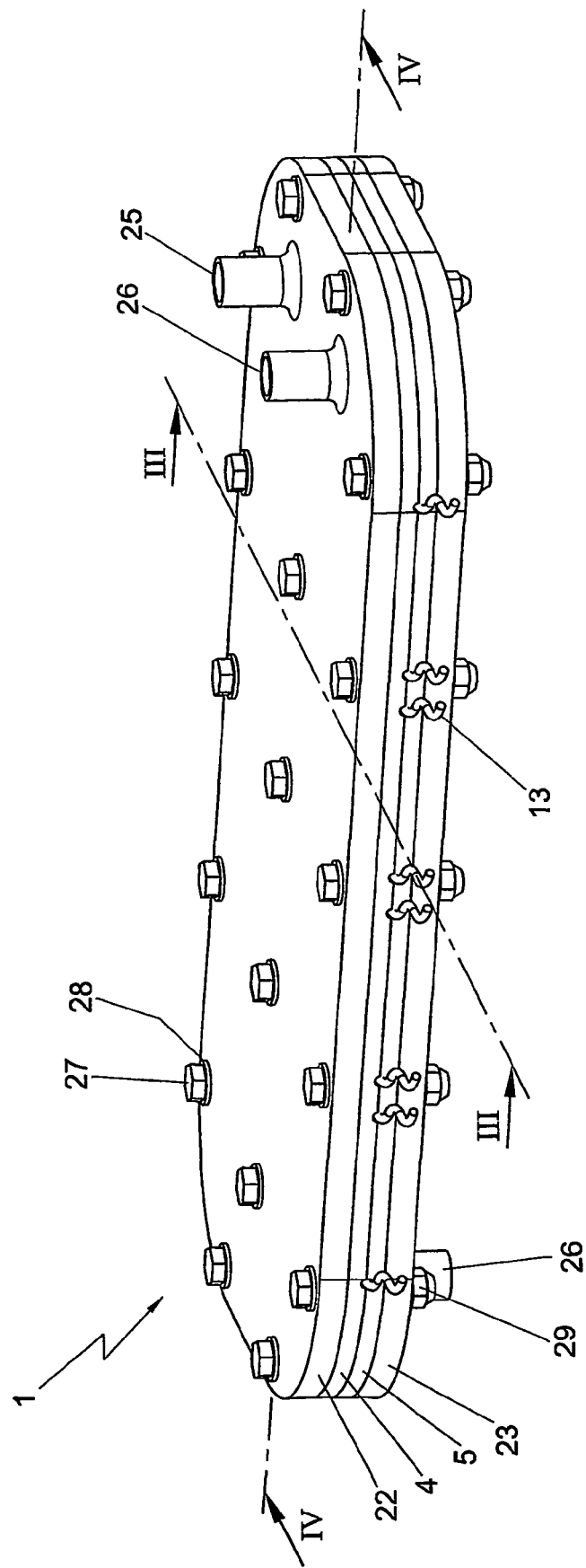
FIG. 1 shows a schematic perspective view of a cooling device according to the invention in assembled condition.
Figure 2:
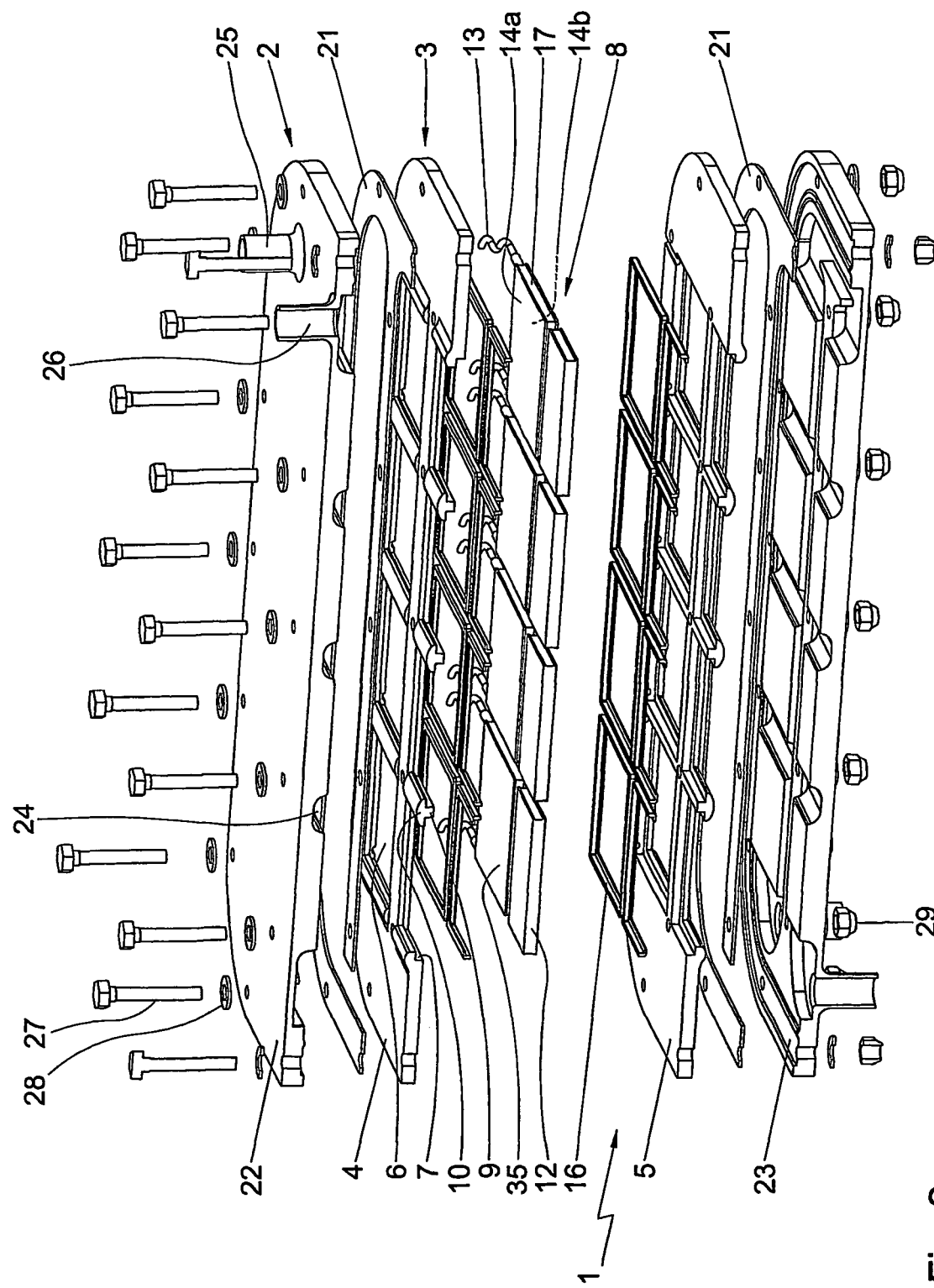
FIG. 2 shows a schematic perspective exploded view of the cooling device according to FIG. 1.
Figure 3:
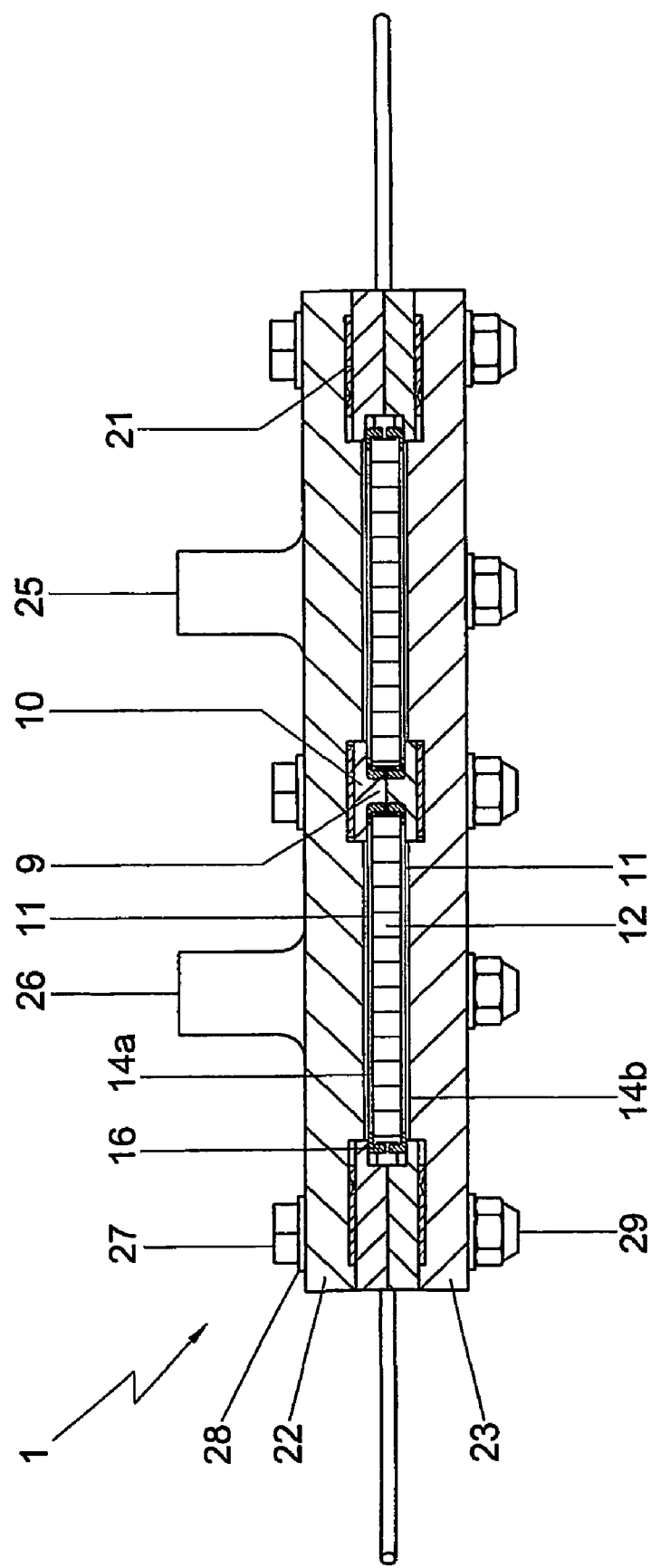
FIG. 3 shows a schematic cross section of the cooling device according to the invention according to the lines III—III in FIG. 1.
Figure 4:
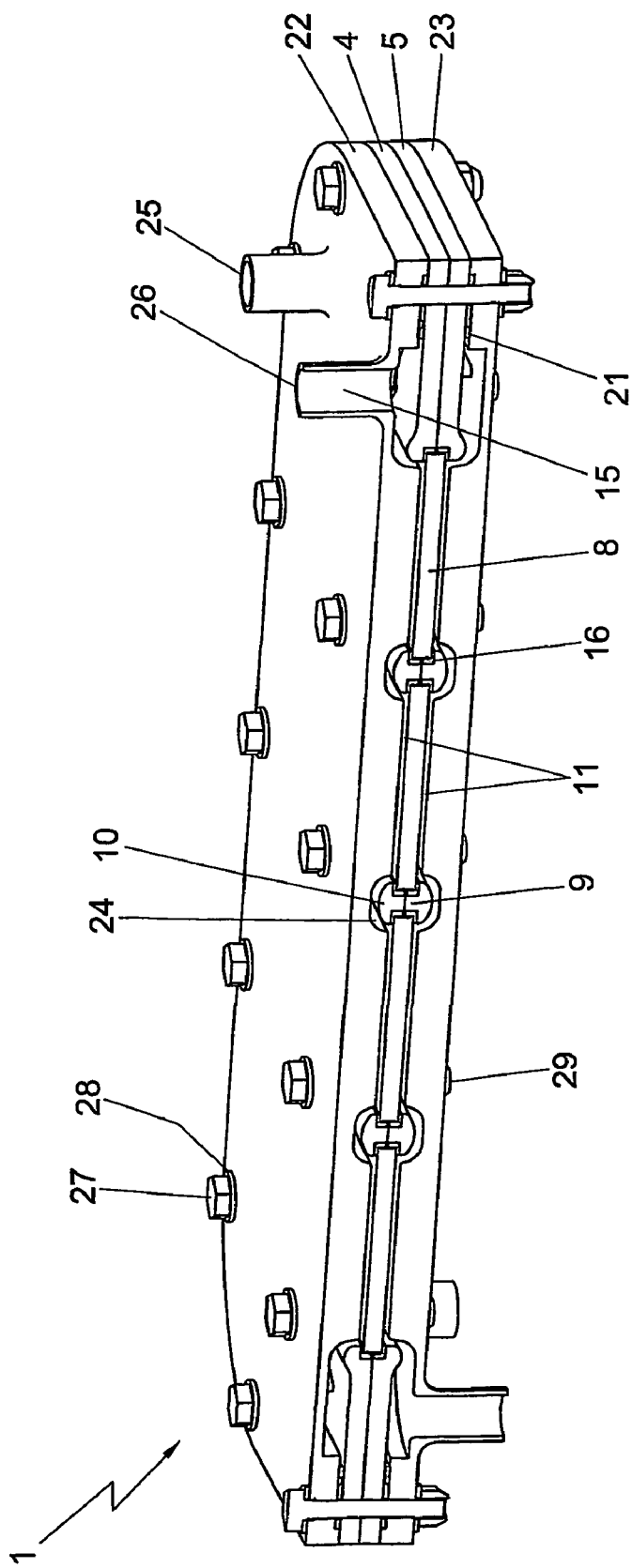
FIG. 4 shows a schematic perspective cross section of the cooling device according to the invention according to the lines IV—IV in FIG. 1.
Figure 5:
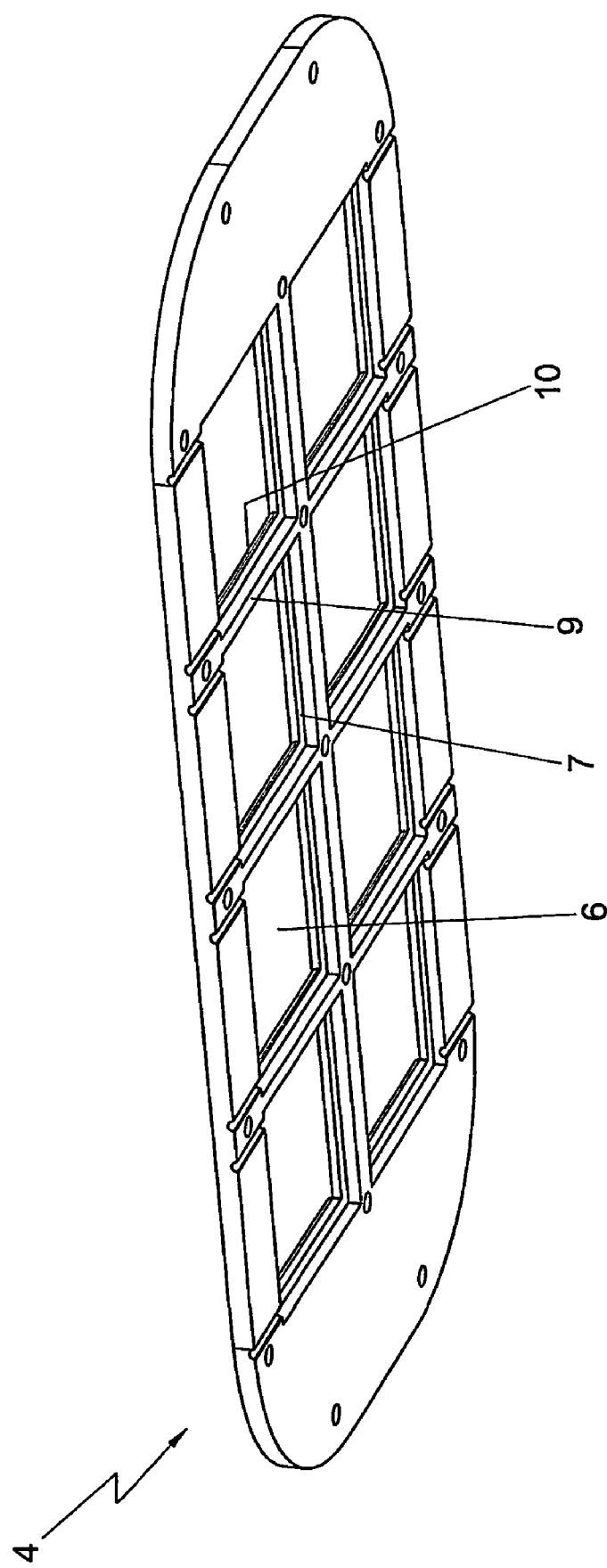
FIG. 5 shows a schematic perspective bottom view of the upper carrier part of the cooling device of FIG. 1.
Figure 6:
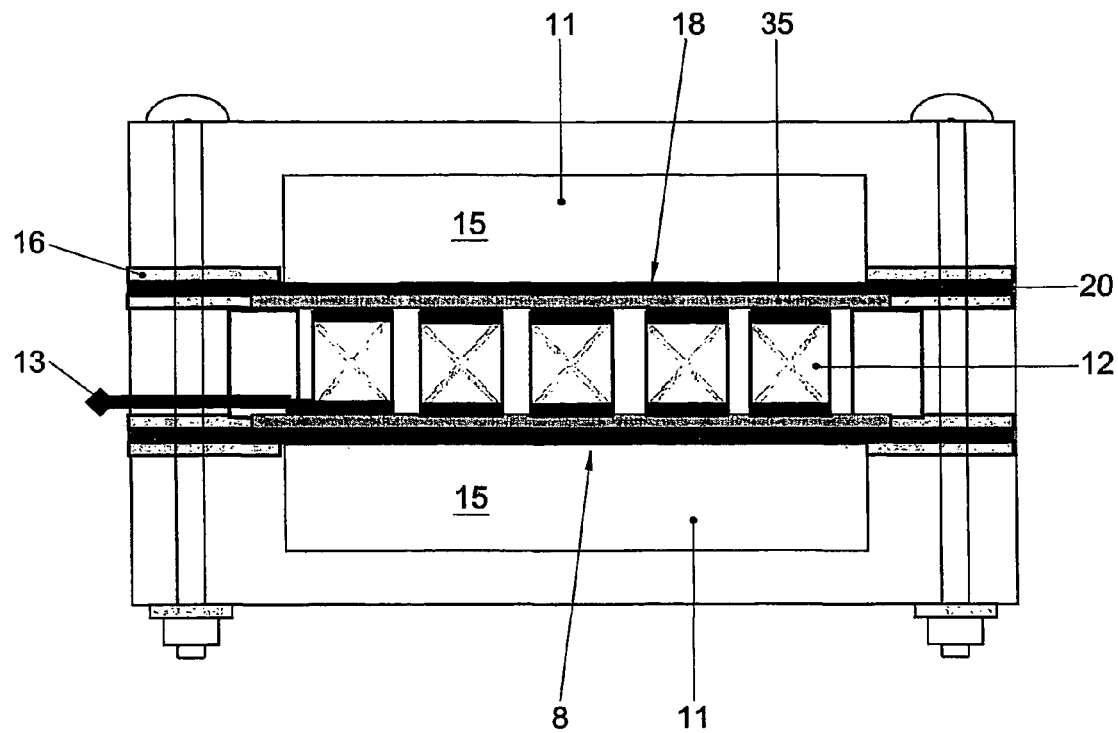
FIG. 6 shows a schematic cross section of a cooling element in another embodiment of a cooling device according to the invention.
Figure 7:
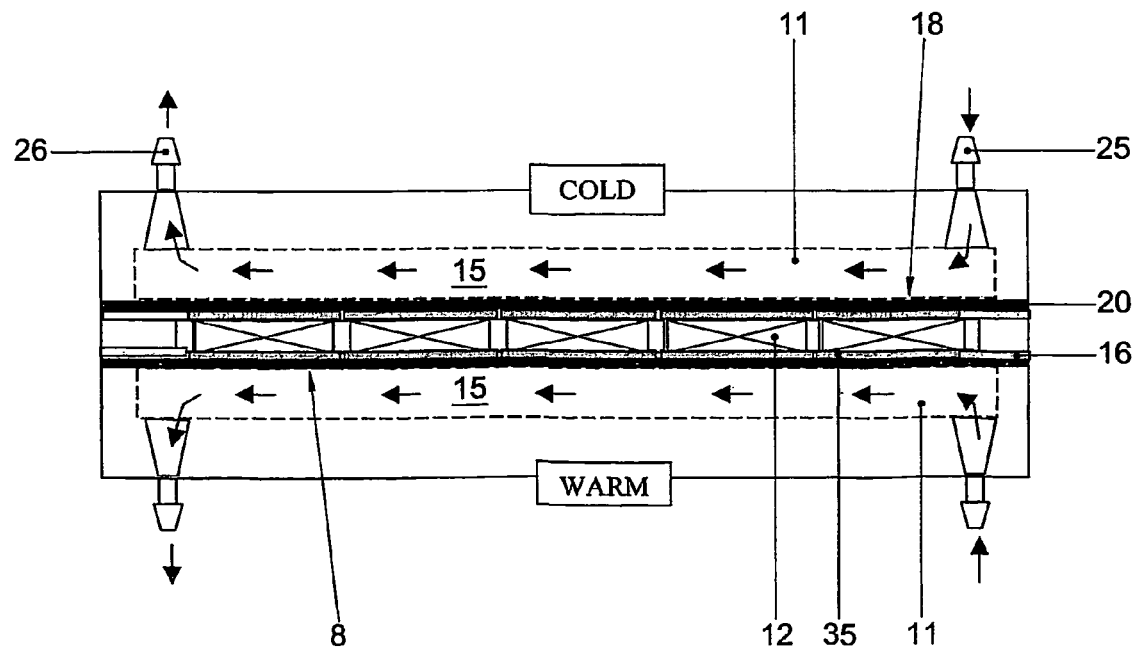
FIG. 7 shows a schematic cross section of the cooling device according to FIG. 6.

By flexibly and sealingly framing the cooling element along its outer perimeter, the size and shape tolerances and the thermal expansion and contraction of the element can be compensated for. By framing the cooling element along its outer perimeter, only the circumference of the cooling element is framed, while the contact surface can remain free to contact the cooling liquid. Within this context, the outer perimeter of the cooling element is meant to comprise the outer edge of the surface of the plates and at least a portion of the rim of that plate.

By arranging the carrier and the contact surface to define a wall portion of the cooling channel the carrier and the cooling element frame therein can be used in an elegant manner to close off the cooling channel. The contact surface and the portion of the carrier being in contact with the liquid together form a barrier shielding the electronics of the cooling element and other parts of the cooling device from the cooling liquid. The electrically insulating contact surface allows for the use of normal water as cooling liquid. Preferably, the insulating contact surface is part of the plate surface, e.g. the plate surface of a ceramic plate.

By flexibly and sealingly framing the cooling element, assembly can be less delicate and the lifetime of the cooling elements can be extended. In particular, standard peltier elements comprising a ceramic upper layer and a ceramic lower layer sandwiching a layer of semiconductor material can be used in mechanically demanding applications and/or applications that require relatively high cooling capacities, such as car climate control systems and portable cooling boxes. Advantageously, a plurality of cooling elements can be framed in a single carrier.

Preferably, the carrier comprises a rigid framework in which the at least one cooling element is framed by means of a flexible packing. The flexible sealing can then be interposed between the carrier and the cooling element. The packing is preferably formed as a flexible gasket, e.g. a round or a rectangular packing ring having a C-, L- or H-shaped cross section.

Preferably, the framework comprises an upper portion and a lower portion between which at least one cooling element is sealingly clamped. Alternatively, the framework can be formed as a singular unit, e.g. by injection molding around the cooling elements. In this way the cooling elements can be framed in an elegant and efficient manner. Preferably, at least one cooling element is a flat, rectangular sandwich.

In an elegant manner, the carrier is substantially planar and frames a plurality of cooling elements, arranged in a row or matrix within a plane. This allows for a cheap and elegant manner to provide a high capacity cooling device. Naturally, the cooling elements can also be stacked e.g. by stacking a plurality of carriers, each comprising one or more cooling elements.

In an alternative embodiment, the carrier comprises a flexible body in which the at least one cooling element is directly framed. Such a carrier, which may have a matlike structure, can e.g. be provided by embedding a plurality of cooling elements in a layer of elastomeric material that keeps the contact surfaces of the cooling elements free. A suitable material for such a carrier is e.g. silicone material or liquid packing material. In an advantageous manner, such a flexible carrier may be provided with reinforcement elements, e.g. embedded rods or stiffening strips on the surface to prevent sagging of the wall portion of the cooling channel formed therewith.

In yet a further embodiment, the housing comprises two cooling channels and the at least one cooling element that is framed in the carrier comprises opposite contact surfaces on both plates of the cooling element, the carrier and the framed cooling elements thus forming a partition between the cooling channels. This allows for a highly compact construction with efficient cooling.

In an elegant manner, the cooling device can be assembled from two housing portions, each having an open cooling channel between which the carrier with framed cooling elements is interposed to close off the cooling channels by forming a partition. To enhance thermal exchange, in at least one of the cooling channels the cooling liquid is forced to move through the channel, preferably in both channels, to increase the cooling capacity. By providing turbulators on the contact surface and/or in the cooling channels, the heat exchange can be increased even further.

Elegantly, the plates of the cooling elements present a plate surface that is impregnated. This way, in case of a porous plate material, such as ceramics, absorption of the cooling liquid into the plate material at the contact surface can be prevented. Alternatively, the cooling element can carry a film that forms the contact surface. This way, an electrically conducting plate can be provided with an electrically insulating contact surface.

In yet another embodiment, the plate surface has a surface structure for increasing the contact area with the cooling liquid. This way, the thermoelectric cooling element can be provided with a higher heat exchanging efficiency, but it can, due its way of framing, still be leakfree. Preferably, the increased contact surface is formed by grooves in the ceramic surface material of a plate or as ceramic protrusions on the ceramic surface of the plate. Although this embodiment allows for high efficiency in heat exchange, it shall be clear that it is also possible to provide cooling fins of other means for increasing the contact surface that are not integrated with the plate and that are e.g. glued to the plate surface. It shall further be clear that a thermoelectric cooling element comprising a layer of semi-conductor material sandwiched between two ceramic plates of which at least one plate is provided with a plate surface with a surface structure for increasing the contact area that is integrated in the ceramic material, can be used advantageously in other types of cooling devices or in other applications. It shall be clear that, as defined in this context, the contact surface presented on the plate surface and is equal to or lesser in area than the plate surface, depending on the way the cooling element is framed, and preferably lies on the plate surface.

The invention also relates to a carrier in which thermoelectric cooling elements are flexibly and sealingly framed.

Further advantageous embodiments of the invention are described in the dependent claims.

Turning now to the Drawings, the figures show only a schematic view of preferred embodiments of the invention. The described embodiments are given by way of non-limiting examples of exemplary embodiments of the invention. In the drawings, identical or corresponding parts are provided with the same reference numerals.

FIGS. 1–7 show a cooling device 1 having a housing 2 comprising several layers of parts. A carrier 3 comprises a rigid upper portion 4 and a rigid lower portion 5 each of them provided with rectangular apertures 6 with recesses 7 for receiving a plurality of identical cooling elements 8 arranged in a matrix structure within a plane. The upper sides of the strips 9 between the apertures 6 are in case of the upper carrier portion or part 4 provided with semi-spherical bulges 10 for conducting cooling liquid 15 in a cooling channel 11 as will be explained in more detail in the following. In case of the lower carrier portion or part 5 the semi-spherical bulges 10 are provided on the lower sides of the strips 9 between the apertures 6.

The cooling elements 8 are commercial available flat thermoelectric coolers (TEC's), also known as peltier elements. In this embodiment the cooling elements 8 have a substantially rectangular form, but it is noted that each specific shape is in principle suited for application of the invention. The coooling element 8 also consists of a number of layers, thus forming a sandwich. The planar upper layer 14a and the lower layer 14b comprise ceramic plates 14, while a semiconductor layer 12 generates in the working mode a temperature difference between the upper ceramic plate 14a and the lower ceramic plate 14b. The cooling element 8 may also comprise more layers, e.g. metal plates with electrical interconnections 13 for providing an electrical current to the semiconductor layer 12.

The thermoelectric coolers 8 are incorporated or framed between the upper carrier part 4 and the lower carrier part 5 employing flexible gaskets 16 which are interposed between the thermoelectric coolers 8 and the carrier parts 4, 5. More precisely, the flexible gaskets 16 in the form of a rectangular packet ring clamp the thermoelectric coolers 8 along its outer perimeter 17 sealingly in the carrier parts 4, 5. In this context the outer perimeter 17 is defined as the outer edge of at least one of the plates 14 inclusive at least a portion of the rim of that plate. The abovementioned assemblage procedure permits the cooling element 8 to have at least one contact surface 18 which in process is in direct contact with the cooling liquid 15. In this embodiment both opposite ceramic plates 14 have a contact surface 18 which during process is in direct contact with the cooling liquid 15, such that the contact surfaces 18 of the cooling elements 8 form in combination with the carrier 3 a partition for the cooling liquid 15 in the cooling channels 11 on each side of the carrier 3, thus avoiding leakage of the cooling liquid 15 to the electronic interconnections 13 and other parts of the cooling elements 8.

In order to admit different kinds of cooling liquids 15 the contact surfaces 18 represented by the plates 14 of the cooling elements 8 are electrically insulating. To that end electrically conducting plates 14 may be provided with an insulating film 20, as may explicitly be seen in FIGS. 6 and 7. Otherwise, the plates 14 may be impregnated to obtain an electrically insulating contact surface. Moreover, ceramic plates, being porous material, become less sensitive to water absorption when the plate surface is impregnated.

The carrier is further sandwiched between an upper housing part 22 and a lower housing part 23 with interposed anti-leakage strips 21 to form the housing 2 with cooling channels 11. The upper cooling channel 11 is on the lower side defined by the partitioning comprising the carrier 3 and the upper contact surfaces 18 of the cooling elements 8, while it is on the upper side defined by the upper housing part 22. As may be seen most obviously in FIG. 4, the lower part of the upper housing part 22 comprises cavities 24 corresponding with the semi-spherical bulges 10 of the upper carrier part 4. This configuration permits a relatively narrow channel geometry which enables a relatively high flow of the cooling liquid 15 and improves the cooling efficiency. The flow of the cooling liquid 15 may be enforced by means of a pump (not shown). Further, the upper housing part 22 is provided with an inflow coupling unit 25 and an outflow coupling unit 26 which are connected to the upper channel configuration 11. The lower cooling channel 11 and the lower housing part 23 are configured in a similar way. The entire assembly is clamped by means of bolts 27, rings 28 and nuts 29.

Referring to FIGS. 1–5 the cooling device 1 thus comprises a housing 2 with at least one cooling channel 11 for a cooling liquid 15, and with at least one thermoelectric cooling element 8 comprising a layer of semiconductor material 12 that is sandwiched between two plates 14. At least one of the plates 14 presents an electrically insulation contact surface 18 that, in use, is in direct contact with the cooling liquid 15. The at least one cooling element 8 is along its outer perimeter 17 flexibly and sealingly framed in a carrier 3 such that the contact surface 18 remains free to contact the cooling liquid 15. The carrier 3 and the contact surface 18 define a wall portion of the cooling channel 11.

Figure 8:
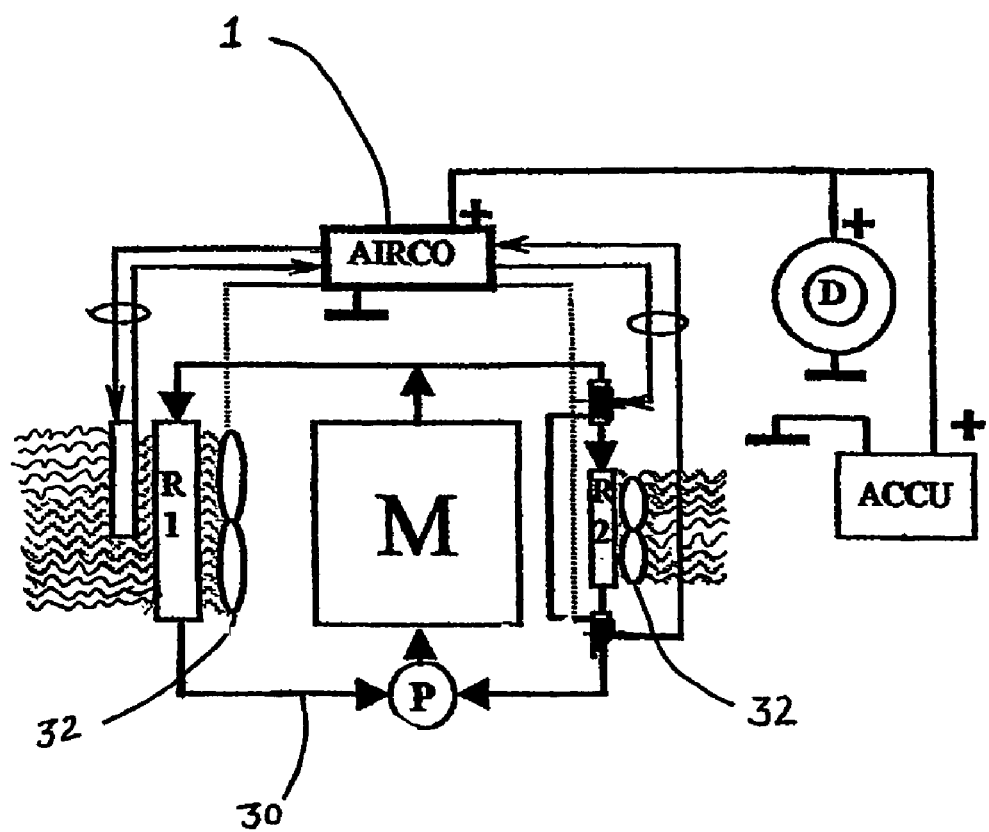
FIG. 8 shows a schematic view of a cooling device according to the invention assembled in a motor cooling system of motor vehicles to serve as an air conditioning system.

Finally, FIG. 8 shows an application of the electric cooling device 1 assembled in a motor cooling system 30 of motor vehicles in order to provide an air conditioning feature to a climate control system. A conventional cooling system of a motor M is provided with a large cooling radiator R1 in front of the motor M and a small cooling radiator R2 in the cabin for heater purposes (not shown), both accomplished with vans 32. The warm liquid of the electric cooling device 1 according to the invention is cooled employing the large cooling radiator R1. This configuration demonstrates a cheap and efficient cooling application in motor cars.

The invention is not limited to the embodiments described in the application. Many variants are possible. Similar variants shall be clear to the person skilled in the art and are to be considered to be within the scope of the invention, as defined in the following claims.

The invention claimed is:

1. A cooling device comprising a housing with at least one cooling channel for a cooling liquid, and with at least one thermoelectric cooling element comprising a layer of semiconductor material that is sandwiched between two plates, at least one of the plates having an electrically insulating contact surface that, in use, is in direct contact with the cooling liquid, the at least one cooling element being, along its outer perimeter, flexibly and sealingly framed in a carrier such that the contact surface remains free to contact the cooling liquid, the carrier and the contact surface defining a wall portion of the cooling channel, wherein the housing comprises two cooling channels and wherein the at least one cooling element framed in the carrier comprises opposite contact surfaces on both plates of the cooling element, the carrier and the framed cooling elements, thus forming a partition between the cooling channels.

2. The cooling device according to claim 1, wherein a plurality of cooling elements is framed in the carrier.

3. The cooling device according to claim 1, wherein the carrier comprises a rigid framework in which the at least one cooling element is framed by means of a flexible packing.

4. The cooling device according to claim 1, wherein the framework comprises an upper portion and a lower portion between which the at least one cooling element is sealingly clamped.

5. The cooling device according to claim 1, wherein the at least one cooling element is a flat, rectangular sandwich.

6. The cooling device according to claim 1, wherein the plates of the at least one cooling element are made of ceramic material.

7. The cooling device according to claim 1, wherein the carrier frames a plurality of identical cooling elements.

8. The cooling device according to claim 1, wherein the carrier is substantially planar and frames a plurality of cooling elements arranged in a row or matrix within a plane.

9. The cooling device according to claim 1, wherein the carrier comprises a flexible body in which the at least one cooling element is directly framed.

10. The cooling device according to claim 9, wherein the flexible body is provided with reinforcement elements.

11. The cooling device according to claim 1, wherein the device comprises two housing portions, each having an open cooling channel between which the carrier with the framed cooling elements is interposed to close off the cooling channels by forming a partition.

12. The cooling device according to claim 1, wherein the plate of the cooling elements has at least one plate surface that is impregnated.

13. The cooling device according to claim 1, wherein the plate of the at least one cooling element carries a film forming the contact surface.

14. The cooling device according to claim 1, wherein the at least one cooling element is provided with a ceramic plate, of which the contact surface has a surface structure for increasing the contact area with the cooling liquid.

15. The cooling device according to claim 1, wherein the at least one cooling element is framed along the outer edges of the surface of at least one of the plates and at least a portion of a rim of at least one of the plates.

* * * * *